United States Patent
Baldwin et al.

(10) Patent No.: US 6,211,769 B1
(45) Date of Patent: Apr. 3, 2001

(54) SYSTEM TO MINIMIZE THE TEMPERATURE COEFFICIENT OF RESISTANCE OF PASSIVE RESISTORS IN AN INTEGRATED CIRCUIT PROCESS FLOW

(75) Inventors: Greg C. Baldwin, Plano; Alwin J. Tsao, Garland, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/207,344

(22) Filed: Dec. 8, 1998

Related U.S. Application Data

(60) Provisional application No. 60/068,467, filed on Dec. 22, 1997.

(51) Int. Cl.$^7$ .................................................. H01C 7/06
(52) U.S. Cl. ................................. 338/7; 338/9; 338/309
(58) Field of Search .............................. 338/7, 8, 9, 22 R, 338/309

(56) References Cited

U.S. PATENT DOCUMENTS

| | | | |
|---|---|---|---|
| 3,491,325 | * | 1/1970 | Hu ............................................. 338/7 |
| 3,683,306 | * | 8/1972 | Bulthuis et al. ........................... 338/7 |
| 4,079,349 | * | 3/1978 | Dorfeld ..................................... 338/9 |
| 4,318,072 | * | 3/1982 | Zandman .................................. 338/7 |
| 4,329,774 | * | 5/1982 | Calligaro ................................. 29/583 |
| 4,489,401 | * | 12/1984 | Lee ......................................... 427/101 |
| 4,677,413 | * | 6/1987 | Zandman et al. ......................... 338/7 |
| 5,240,511 | * | 8/1993 | Kapoor ................................. 148/33.2 |
| 5,414,404 | * | 5/1995 | Jeong et al. ........................... 338/307 |
| 5,640,137 | * | 6/1997 | Mantha ................................. 338/308 |

* cited by examiner

Primary Examiner—Michael L. Gellner
Assistant Examiner—Kyung S. Lee
(74) Attorney, Agent, or Firm—Wade James Brady, III; Frederick J. Telecky, Jr.

(57) ABSTRACT

An integrated circuit containing a resistor and the resistor per se. The circuit includes a substrate (2), a semiconductor resistor (3) on the substrate and a layer of electrically insulating material (5) disposed over the substrate and the semiconductor resistor having at least one contact (11, 13, 15) extending therethrough to the semiconductor resistor, the contact having an electrical path therein extending to and forming an interface with an end portion of the semiconductor resistor. The semiconductor resistor has a semiconductor resistor body, preferably of doped polysilicon, having one of a positive or negative temperature coefficient of resistance and a resistor head. The resistor head consists essentially of the electrical path which is metal interconnect, the contacts and then interface to and from the resistor body and in contact with the resistor body, the resistor head having the other of a positive or negative temperature coefficient of resistance.

10 Claims, 1 Drawing Sheet

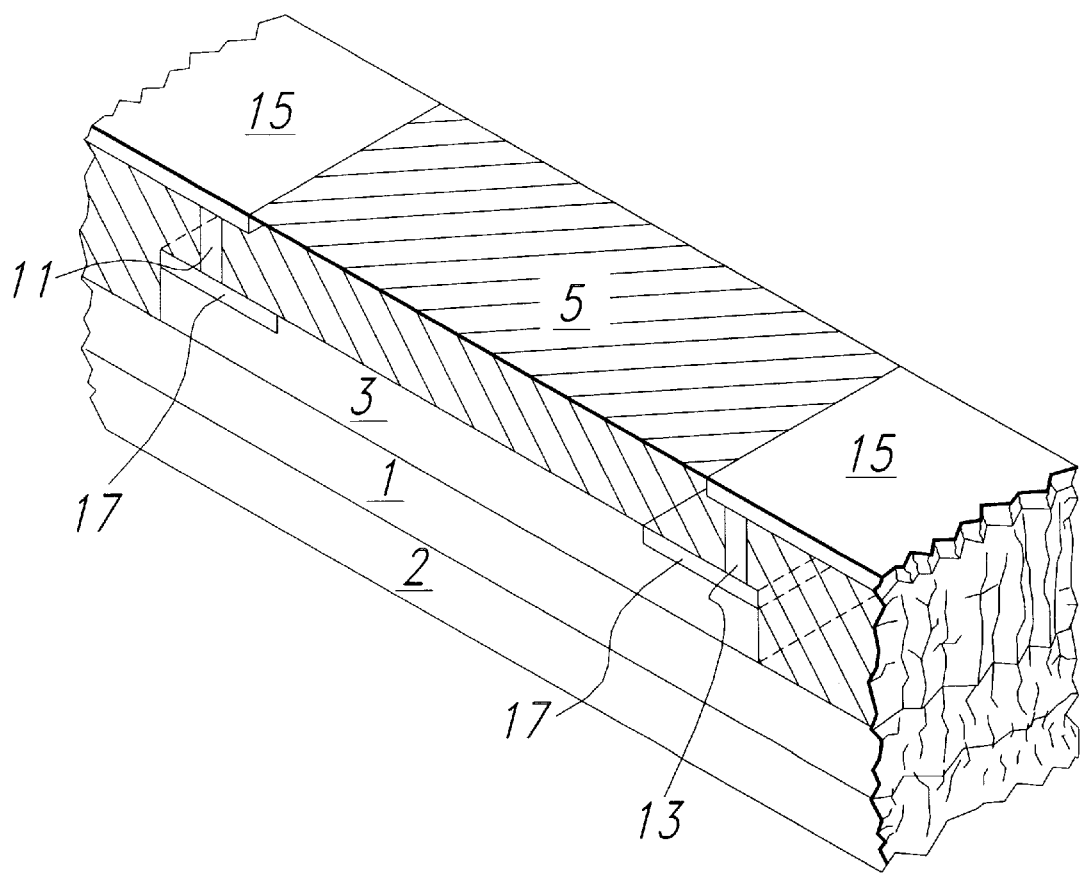

SYSTEM TO MINIMIZE THE TEMPERATURE COEFFICIENT OF RESISTANCE OF PASSIVE RESISTORS IN AN INTEGRATED CIRCUIT PROCESS FLOW

This application claims priority under 35 USC 119(e)(1) of provisional application Ser. No. 60/068,467 filed Dec. 22, 1997.

BACKGROUND OF THE INVENTION

1. Field of the Invention

This invention relates to a system for fabricating passive resistors in integrated circuits that display minimal change in resistance over a wide range of operating temperatures.

2. Brief Description of the Prior Art

Integrated circuits are generally fabricated with polysilicon resistors that are formed on the semiconductor substrate. Such resistors generally have a resistor body, generally formed of doped polysilicon and generally having metallic leads coupled to opposing ends of the resistor body, generally through contacts in field oxide. The contacts are connected to metal interconnect. The resistor body can be formed concurrently with polysilicon transistor gate electrodes, such resistor body generally doped and generally resting on the field oxide.

Integrated circuits that require passive resistors often have tight tolerances on the resistance value of these resistors. However, these prior art semiconductor resistors are subject to variations in resistance value. Sources of variation in the resistance value of these resistors include process fluctuations that result in physical changes to the resistor properties such as physical dimension or resistivity and changes in temperature. The sources of change in temperature can be either external to the resistor itself or internal due to the self-heating effects associated with power dissipation. As the resistor temperature changes, the value of resistance of the resistor also changes.

The general prior art method utilized for minimizing the resistance alteration effects due to the temperature coefficient of resistance (TCR) of a semiconducting resistor (a resistor formed of semiconductor material) is to increase the doping concentration in the resistor body to a sufficiently high level such that the TCR of the resistor body is at a minimum. Then the resistors are built with dimensions that make the resistor head resistance a small percentage of the resistor body resistance. As a result, the resistor head TCR has little effect on the overall resistor temperature characteristics.

To reach sufficiently low TCR conditions in the resistor body alone, the impurity or doping concentration must be very high, about $3 \times 10^{20}$ atoms/cm$^3$ for polysilicon resistors. Extra processing steps are often required to reach this level of impurity concentration. These steps add cost to the production of the circuit and limit the range of resistance values obtainable in that the sheet resistance ($R_s$) is low (about 70 to about 100 ohms/square). The simple expression for resistance is $R=R_s(L/W)$, where L is length and W is width of the resistor body. This equation shows that to achieve the desired value of R when $R_s$ is low, W must be minimized (which increases the head component of resistance and increases process variability) and/or L must be increased, the latter increasing capacitance and area consumed on the chip. The increase in length is also detrimental at high frequency where these resistors are sometimes used.

SUMMARY OF THE INVENTION

In accordance with the present invention, the above described inadequacies of prior art resistors are minimized.

The change in resistance with temperature of a semiconducting material can be modeled by a numerical fit that takes the form:

$$R(T)/R(T_0) = 1 + TCR1 \times (T-T_0) + TCR2 \times (T-T_0)^2$$

where the resistance at temperature T is R(T), $T_0$ is the initial or reference temperature and TCR1 and TCR2 are the fitting coefficients for the resistor body and the two resistor heads which make connection at opposite ends of the resistor body respectively. The above equation applies to the body or the head separately. In other words, the above equation can be used for either the body or for the head of the resistor individually. Then the coefficients TCR1, TCR2 which are the numerical fitting coefficients are found by fitting the equation to the data. It can be thought of as fitting the expression $y = 1 + ax + bx^2$ to some data where a and b are the fitting coefficients. For every case (level of doping concentration) that has been observed for polysilicon resistors, the second fitting coefficient TCR2 is several orders of magnitude lower than TCR1, so TCR2 has almost no effect on the equation over the temperature range of interest, this being from about −55° C. to about 140° C. This equation represents the best fit to the resistance data taken over the above range of temperatures. The temperature coefficients of resistance TCR1 and TCR2 for the resistor body can be either negative for low to mid levels of doping concentration or positive for very high levels of doping concentration. The same statement applies to the head TCR1 and TCR2, but the head TCR1 and TCR2 generally do not change from negative to positive at the same doping concentration as the body.

When a semiconducting material is used for the resistor body, electrical contacts are made to the resistor body in a region known as the resistor head. Typically, the electrical path to the resistor body is made through metal leads and contacts and possibly a metal or metallic compound in contact with the resistor body. For the present discussion, the combination of all of these components is considered to be the resistor head. The total resistance of the resistor structure can be written as $R = R_b + 2 \times R_h$, where $R_b$ is the resistance of the resistor body and $R_h$ is the resistance of each resistor head. Both $R_h$ and $R_b$ will have temperature characteristics as described by the above equation in $R(T)/R(T_0)$. The temperature coefficients of the resistor heads, which include the interface resistance (or contact resistance) between the resistor head material and the resistor body, can be different from the temperature coefficients of resistance of the resistor body. Metals and metallic compounds typically have positive coefficients or resistance. The head-to-resistor body interfaces may have either positive or negative temperature coefficients of resistance, depending upon the doping concentration in the body.

When the resistor body is built with an overall negative coefficient of resistance, the above equation in $R(T)/R(T_0)$ when applied to $R_b$ becomes less than 1 for temperatures greater than $T_0$ and the value of $R_b$ decreases with increasing temperature. When the resistor head is built with an overall positive coefficient of resistance, the value of $R_h$ increases with increasing temperature or the $R(T)/R(T_0)$ equation becomes greater than 1 when applied to $R_h$. With proper design of the physical dimensions of the resistor heads and resistor body, the magnitude of the increase in resistance of the resistor heads can offset the magnitude of the decrease in resistance of the resistor body, resulting in very low overall change in resistance for the entire resistor structure.

The above described method of reducing changes in resistance due to temperature allows precision passive resistor structures to be built with materials that are already available in the process flow. No extra processing steps are generally required unless the polysilicon resistor is part of a self-aligned silicide process flow in which case one additional process step is required. The silicide must be blocked from the resistor body, usually by a patterned oxide or nitride. Extra processing can be provided to change the resistivity of the resistor body or resistor heads, however the above solution provides the desired result, whether or not extra processing is utilized.

The procedure in accordance with the present invention generally does not require additional processing steps as required in the prior art to obtain the high doping levels since lower impurity concentrations in the semiconductor which do not require the additional processing are generally adequate. In addition, the method in accordance with the present invention can take advantage of the positive TCR associated with metal leads and contacts that are commonly used in the manufacture of integrated circuits. If only the resistor body TCR is minimized, then the methods used to electrically connect the resistor to the rest of the circuit will only result in an increase in resistance with temperature. This change in resistance will be significant for resistors built with low values of resistance. The resistor design described herein can be used to minimize the effects of changing temperatures on the change in resistance of the overall resistor structure.

A semiconductor resistor is fabricated in accordance with the present invention by providing a semiconductor resistor body, preferably of doped polysilicon with the doping level depending upon whether the resistor is to display a positive or negative TCR. The resistor is formed as a part of an integrated circuit and rests on the upper surface of or over a substrate. The resistivity also changes with doping concentration. Resistivity generally decreases with increasing doping concentration. Since the sheet resistance ($R_s$) is the resistivity ($\rho$) divided by the film thickness (t) or $R_s = \rho/t$, the sheet resistance value also changes with any change in the doping concentration chosen. Therefore, to provide a target value of resistance R, the resistor length and/or width can be adjusted accordingly since $R = R_s(L/W)$. In practice, generally the full equation for R, which includes the head components, is used, this being $R = R_b + 2R_h = R_s(L/W) + 2R_h$. Typically, the resistor rests on field oxide, so it will be covered by the material used to insulate metal from the substrate/polysilicon. A pair of contacts are formed through the electrical insulator at opposite ends of the resistor body. Each contact contains an electrically conductive material, preferably a refractory metal such as, for example, titanium in a thin layer with most of the contact filled with either tungsten or aluminum. This forms a refractory metal silicide interface with the resistor body or polysilicon doped with, for example, phosphorus to a level to provide a thermal coefficient or resistance within the contact sufficient to offset the thermal coefficient of resistance of the resistor body. A metal interconnect connects the conductor in the contacts to other components in standard manner.

There are many ways to achieve opposite signs for the body and head TCR. One example is to dope the polysilicon resistor body with a $1 \times 10^{20}$ atoms/cm$^3$ concentration of arsenic and a $2 \times 10^{20}$ atoms/cm$^3$ concentration of phosphorus. The body TCR1 has been demonstrated to be positive for phosphorus concentrations of about $2.4 \times 10^{20}$ atoms/cm$^3$ and higher, and the head TCR1 has been demonstrated to be positive for phosphorus concentrations of about $1.6 \times 10^{20}$ atoms/cm$^3$ and higher, a concentration of $2 \times 10^{20}$ atoms/cm$^3$ therefore providing a positive head TCR1 with a negative body TCR1 (TCR2 is being neglected because its effect is minimal in the temperature range of interest which is from about $-55°$ C. to about $140°$ C.).

Phosphorus alone or boron alone can be used. The polysilicon body TCR1 is positive for boron doping concentrations of $1.6 \times 10^{20}$ atoms/cm$^3$ and greater while the head TCR1 remains negative for all levels of doping concentration that have been observed, these levels being from $9 \times 10^{19}$ atoms/cm$^3$ to $3.2 \times 10^{20}$ atoms/cm$^3$. All of the doping concentrations listed above change for different process flows. The polysilicon grain size changes, depending upon the deposition scheme used, film thickness, and thermal cycles in the process flow. The amount of activated dopant will change as a function of the amount and type of thermal processing used. Both polysilicon grain size and dopant activation alter the TCR characteristics, thus requiring different doping concentrations with changes in these factors. It follows that actual dopant values are somewhat empirical and must be adjusted to the conditions.

BRIEF DESCRIPTION OF THE DRAWING

The FIGURE is a schematic diagram of a semiconductor resistor in accordance with the present invention.

DESCRIPTION OF THE PREFERRED EMBODIMENT

Referring to the FIGURE, there is shown a semiconductor resistor body 3 which is formed as a part of an integrated circuit and rests on the upper surface of a field oxide 1 which rests over a substrate 2. The resistor body 3 is formed of polysilicon and doped with phosphorus to a level of $2 \times 10^{20}$ atoms/cm$^3$ and with arsenic to a level of $1 \times 10^{20}$ atoms/cm$^3$ to provide a negative coefficient of resistance to the resistor body. A layer of insulating dielectric 5 rests over the resistor body 3 and the field oxide 1. A pair of contacts 11, 13 extend through the insulating dielectric at opposite ends of the resistor body 3, each contact containing a titanium barrier layer with the apertures containing the contacts then being filled with tungsten or aluminum with a positive coefficient of resistance within the contacts. This forms an interface of titanium silicide 17 with the resistor body 3 sufficient to offset the negative coefficient of resistance of the resistor body. The titanium silicide 17 is formed during the standard SAlicide (self-aligned silicide) process. The titanium silicide is prevented from forming on the resistor body by depositing an insulating material on the body prior to SAlicide formation or by using the sidewall nitride. A metal interconnect 15 connects the tungsten or aluminum 11, 13 in the contacts to other components in standard manner.

The process used to prevent the titanium silicide from forming on the resistor body is as follows:

1) an insulator is deposited which may be an oxide or may use the sidewall nitride.

2) the insulator is patterned so that it covers only the resistor body.

3) the insulator is etched away from non-patterned areas. Thus, when the standard titanium silicide process is used, it forms only on the resistor heads. The above steps are not required where a self-aligned silicide process is not used.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A system for minimizing the temperature coefficient of resistance of a semiconductor resistor which is part of an integrated circuit which includes:
   (a) a semiconductor body having a first dielectric surface region;
   (b) a semiconductor resistor body disposed on said first dielectric region, said resistor body having one of a positive or negative temperature coefficient of resistance;
   (c) a second dielectric layer disposed over said resistor body; and
   (d) a resistor head extending through said second dielectric layer to said resistor body, said resistor head consisting essentially of an electrical path and interface to and from the resistor body and in contact with the resistor body and in series with the resistor body, said resistor head having the other of a positive or negative temperature coefficient of resistance offsetting the change in resistance with temperature of said semiconductor resistor body.

2. The resistor of claim 1 wherein said resistor body is doped polysilicon.

3. The resistor of claim 2 wherein said resistor body is doped to have a negative temperature coefficient of resistance and said resistor head has a positive temperature coefficient of resistance.

4. The resistor of claim 3 wherein said electrical path of said resistor head includes doped polysilicon.

5. The resistor of claim 2 wherein said electrical path of said resistor head includes doped polysilicon.

6. The resistor of claim 3 wherein said electrical path of said resistor head is doped to have said positive temperature coefficient of resistance.

7. The resistor of claim 1 wherein said resistor body is doped to have a negative temperature coefficient of resistance and said resistor head has a positive temperature coefficient of resistance.

8. The resistor of claim 7 wherein said electrical path of said resistor head includes doped polysilicon.

9. The resistor of claim 7 wherein said electrical path of said resistor head is doped to have said positive temperature coefficient of resistance.

10. The resistor of claim 1 wherein said electrical path of said resistor head includes doped polysilicon.

* * * * *